United States Patent
Baba

(10) Patent No.: US 6,222,709 B1
(45) Date of Patent: Apr. 24, 2001

(54) DEVICE AND METHOD FOR SUPPLYING ELECTRIC POWER TO A LOAD

(75) Inventor: Akira Baba, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/502,213

(22) Filed: Feb. 11, 2000

(30) Foreign Application Priority Data

Feb. 14, 1999 (JP) .................................... 11-074260
Feb. 7, 2000 (JP) .................................... 12-029581

(51) Int. Cl.$^7$ ................................ H02H 7/00; G05F 1/40
(52) U.S. Cl. .............................................. 361/18; 323/282
(58) Field of Search .................... 323/282, 283, 323/285; 361/18, 87, 91, 93, 98; 320/22, 30, 39

(56) References Cited

U.S. PATENT DOCUMENTS

| | | | |
|---|---|---|---|
| 4,476,427 | * 10/1984 | Kaneko et al. | 323/234 |
| 4,553,187 | * 11/1985 | Burns et al. | 361/96 |
| 4,812,943 | * 3/1989 | Jones et al. | 361/92 |
| 5,444,595 | * 8/1995 | Ishikawa et al. | 361/86 |
| 5,892,351 | * 4/1999 | Faulk | 320/125 |
| 5,905,357 | * 5/1999 | Kawasaki | 320/104 |

FOREIGN PATENT DOCUMENTS

| | | |
|---|---|---|
| 1-227520 | 9/1989 | (JP) . |
| 2-266836 | 10/1990 | (JP) . |
| 3-262209 | 11/1991 | (JP) . |
| 4-134271 | 5/1992 | (JP) . |
| 5-52880 | 3/1993 | (JP) . |
| 6-27157 | 2/1994 | (JP) . |
| 6-61432 | 3/1994 | (JP) . |
| 6-188704 | 7/1994 | (JP) . |
| 6-244693 | 9/1994 | (JP) . |
| 9-145749 | 6/1997 | (JP) . |

* cited by examiner

Primary Examiner—Matthew Nguyen
(74) Attorney, Agent, or Firm—Finnegan, Henderson, Farabow, Garrett & Dunner, L.L.P.

(57) ABSTRACT

An improved electric power supply control device for supplying electric power to a load from a battery is described. The electric power supply control device is composed of a semiconductor switch connected between the electric power source and the load in order to controlling the power supply to the load, an excessive electric current detecting circuit for detecting an excessive electric current flowing through the load, a protection circuit connected to the semiconductor switch for turning off the semiconductor switch if the excessive electric current detecting circuit detects an excessive electric current, and a control circuit for disabling the protection circuit from turning off the semiconductor switch if the rate of increase of the electric current as flowing through the load is smaller than a predetermined rate.

5 Claims, 7 Drawing Sheets

DEVICE AND METHOD FOR SUPPLYING ELECTRIC POWER TO A LOAD

CROSS REFERENCE TO RELATED APPLICATIONS

The subject application is related to subject matter disclosed in the Japanese Patent Application No.Heill-074260 filed in Feb. 14, 1999 in Japan, to which the subject application claims priority under the Paris Convention and which is incorporated by reference herein.

BACKGROUND OF THE INVENTION

1. Field of the Invention

The present invention is related to an improvement of a device and method for supplying electric power to a load, and more particularly, to a device and method for switchingly supplying electric power to loads from a battery.

2. Prior Art

FIG. 1 is a circuit diagram showing an exemplary prior art electric power supply control device provided with a semiconductor switch. The electric power supply control device of this prior art example is provided for supplying electric power from a battery selectively to the respective loads located in a motor vehicle.

In the same figure, the electric power supply control device of this prior art example includes a temperature sensor FET QF and a shunt resistor RS connected in series and located upon the electric current path provided for supplying the output voltage VB of an electric power source 101 to a load capacitance 102 such as a headlamp, a driving motor for controlling the open/close operation of a power window. Also, the electric power supply control device is provided with a driver circuit 901 for detecting the electric current flowing through the shunt resistor RS and taking control of the operation of the temperature sensor FET QF by means of a hardware circuit, the analog-digital converter 902 for taking control of on/off operation of the temperature sensor FET QF on the basis of the electric current level as monitored by the driver circuit 901, and a microcomputer (CPU) 903.

Furthermore, the temperature sensor FET QF is equipped with a built-in temperature sensor (not shown in the figure) and functions as a semiconductor switch which forcibly turns off the temperature sensor FET QF itself by means of a built-in gate shutdown circuit when the temperature of the temperature sensor FET QF elevates beyond a predetermined level. In the same figure, the reference RG designates an internal resistor while the reference ZD1 designates a zener diode for maintaining the voltage between the gate G and the source S in order to enable an excessive voltage as applied to the gate G to bypass the gate G.

In the case of the electric power supply control device of this prior art example, there is provided with a protection mechanism for protecting the temperature sensor FET QF and/or the load capacitance 102 from suffering from an excessive electric current. Namely, the driver circuit 901 is composed of differential amplifiers 911 and 913 functioning as an electric current monitoring circuit, a differential amplifier 912 functioning as an electric current limiting circuit, a charge pump circuit 915, a driving circuit 914 for driving the gate G of the temperature sensor FET QF through the internal resistor RG on the basis of the judgment signal of an excessive electric current given from the electric current limiting circuit and the control signal of the on/off operation given from the microcomputer 903.

When the electric current passed through the electric power supply control device exceeds a reference level (the upper limit) followed by detecting an excessive electric current, the temperature sensor FET QF is turned off by means of the driving circuit 914. The temperature sensor FET QF is then turned on when the electric current level has dropped below a reference level (the lower limit).

On the other hand, the electric current is continuously monitored through the electric current monitoring circuit (the differential amplifiers 911 and 913) under the control of the microcomputer 903. If an abnormal electric current flows beyond the normal level, the temperature sensor FET QF serves to turn off the driving signal in order to turn off the temperature sensor FET QF. Meanwhile, if the temperature of the temperature sensor FET QF exceeds a predetermined level before the microcomputer 903 outputs the driving signal to turn off the temperature sensor FET QF, the temperature sensor FET QF is turned off by means of an overheat shutdown mechanism.

However, in the case of the prior art electric power supply control device as explained above, there are shortcomings that the shunt resistor RS has to be provided in series with the electric power supplying line in order to detect an abnormal electric current passing therethrough, and therefore the heat dissipation of the shunt resistor becomes problematic because the electric current passing through the load has increased, while the on resistance of the temperature sensor FET QF has currently decreased in the recent years.

Also, while the overheat shutdown mechanism and the excessive electric current limiting circuit as explained above can function properly when there is formed a typical short-circuit in the load 102 or the related wirings resulting in a large electric current, they no longer can properly function when the short-circuit is formed imcomplete, i.e., rare shorting, resulting in a certain short-circuit resistance. In this case, the abnormal electric current has to be detected by means of the microcomputer 903 through the electric current monitor circuit in order to turn off the temperature sensor FET QF. However, the responsibility to the abnormal electric current is not sufficient.

Also, there are further shortcomings that the circuit has tube provided with the shunt resistor RS, the analog-digital converter 902, the microcomputer 903 and the like, resulting in a large volume the circuit. These elements are relatively expensive so that the production cost of the device is elevated.

Furthermore, the excessive electric current limiting circuit serves also to detect an excessive electric current which is not originating from a trouble of the hardware so that the electric current supply is unnecessarily halted resulting in damage to the usability.

The present invention has been made in order to solve the shortcomings as described above. It is an object of the present invention to provide an electric power supply control device and the electric power supply control method for awaiting for recovery of the normal condition of the electric power supply control device, when an excessive electric current which is not originating from a trouble of the hardware is flowing, rather than immediately shutting down the current path of the excessive electric current, in addition to the function for detecting an excessive electric current due to occurrence of a short-circuit originating from a trouble of the hardware.

SUMMARY OF THE INVENTION

In brief, the above and other objects and advantages of the present invention are accomplished by a new and improved electric power supply control device for supplying electric power to a load from a battery comprising: a semiconductor switch connected between said electric power source and said load in order to control the power supply to said load; an excessive electric current detecting circuit for detecting an excessive electric current flowing through said load; a protection circuit connected to said semiconductor switch for turning off said semiconductor switch if said excessive electric current detecting circuit detects an excessive electric current; and a control circuit for disabling said protection circuit from turning off said semiconductor switch if the rate of increase of the electric current as flowing through said load is smaller than a predetermined rate.

Furthermore, in accordance with a preferred embodiment of the present invention, the rate of increase of the electric current is detected by measuring the level of the electric current a predetermined time after the supply of the electric power to said load is initiated.

Furthermore, in accordance with a preferred embodiment of the present invention, said control circuit serves to enable said protection circuit from turning off said semiconductor switch after disabling said protection circuit.

In accordance with another aspect of the present invention, a electric power supply control method for supplying electric power to a load from a battery comprising the steps of: initiating supply of electric power to said load; detecting the rate of increase of the electric current through said load; continuing the supply of electric power to said load if the rate of increase of the electric current through said load is lower than a predetermined value; and halting the supply of electric power to said load if the rate of increase of the electric current through said load is lower than a predetermined value.

Furthermore, in accordance with a preferred embodiment of the present invention, the step of detecting the rate of increase of the electric current through said load is performed by measuring the magnitude of the electric current a predetermined time after initiating supply of electric power to said load.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF EMBODIMENTS

In the followings, an electric power supply control device and an electric power supply control method in accordance with the present invention will be explained in details with reference to FIG. 2 through FIG. 8. The electric power supply control device and the electric power supply control method will be explained in the following on the assumption that the present invention is applied to, e.g, the wiring harness of a motor vehicle such as the control device for taking control of a power window and the like by supplying electric power to the driving motor of this load from a battery. However, the application of the present invention is not limited to the example but applicable to any of such electric power supply control devices and electric power supply control methods for switchingly supplying electric power to loads from a battery.

Figure 1:
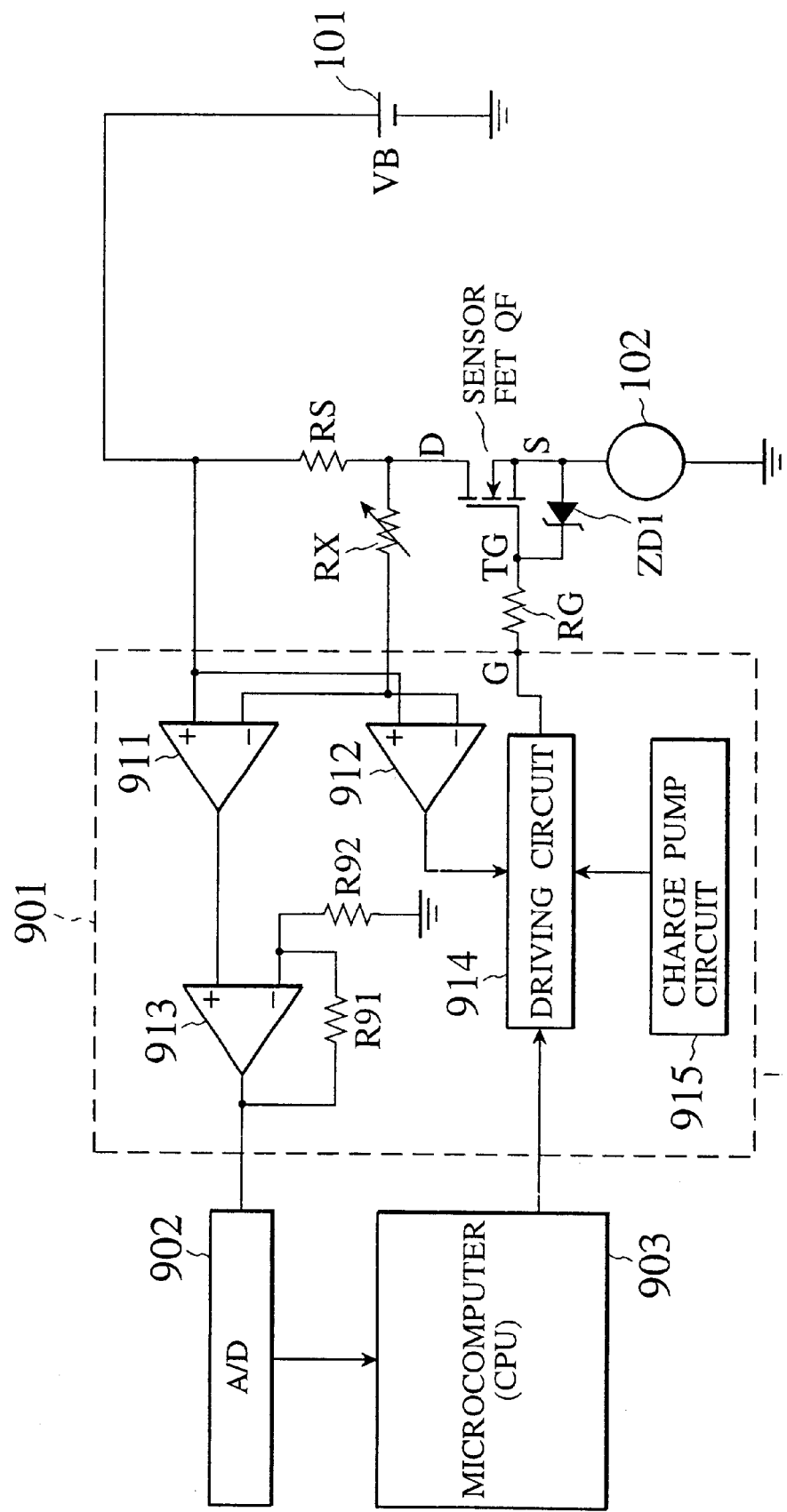
FIG. 1 is a circuit diagram showing an exemplary prior art electric power supply control device equipped with a semiconductor switch.
Figure 2:
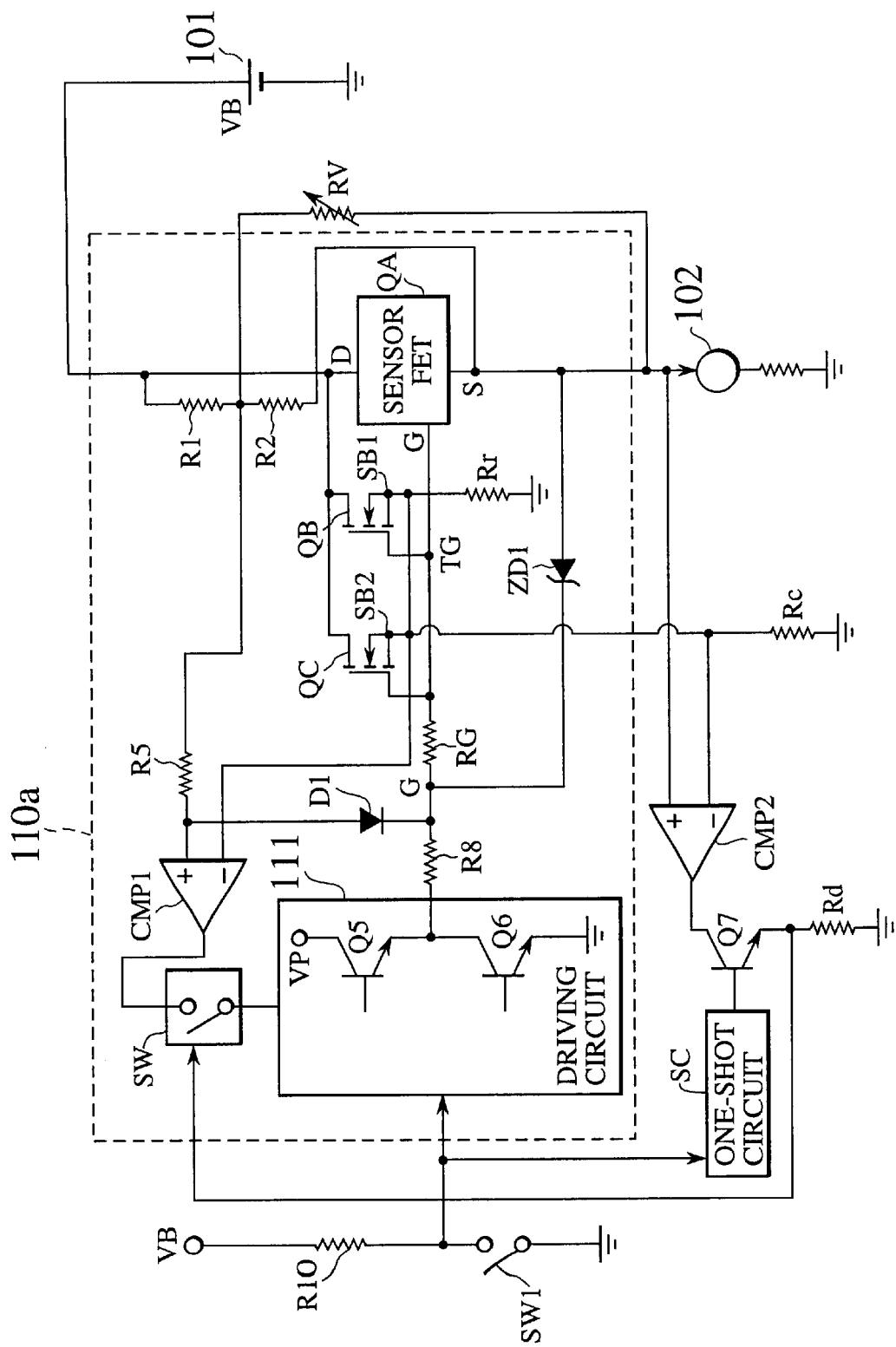
FIG. 2 is a circuit diagram showing the electric power supply control device in accordance with an embodiment of the present invention.
Figure 3:
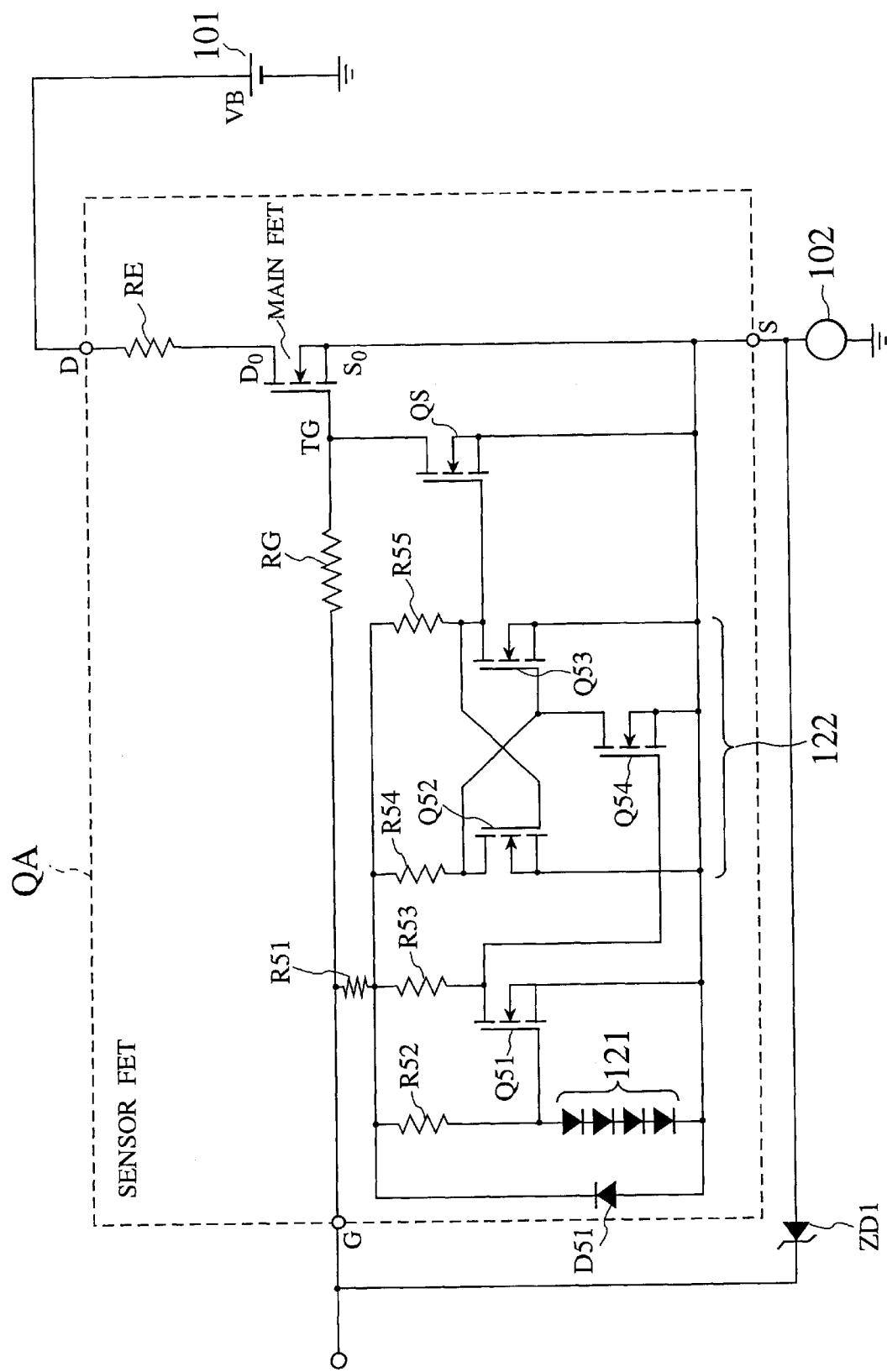
FIG. 3 is a circuit diagram showing the semiconductor switch for use in the embodiment of the present invention
Figure 4:
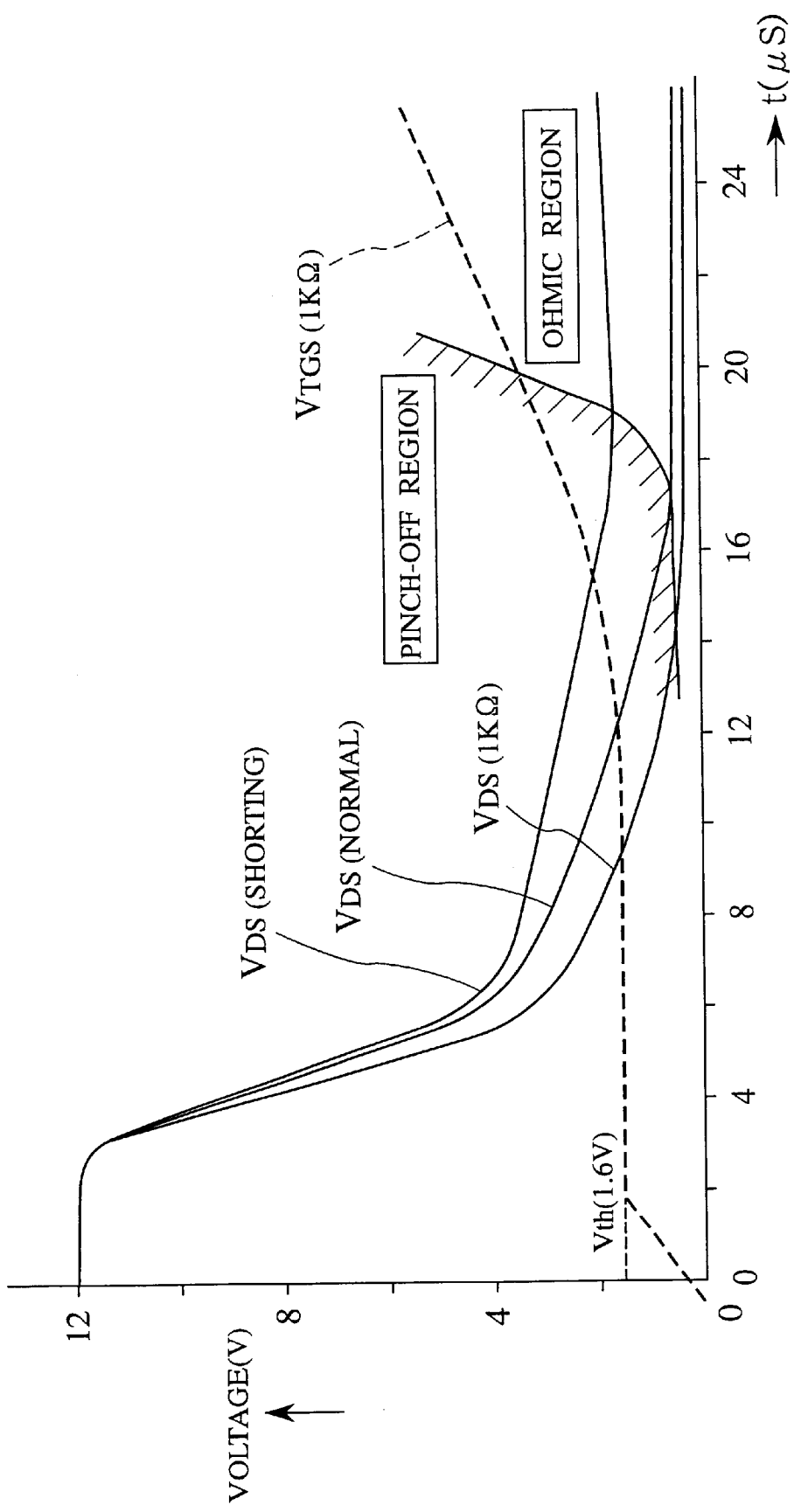
FIGS. 4 to 6 are explanatory views for explaining the operational mechanism of the electric power supply control device and the electric power supply control method in accordance with the present invention.
Figure 5:
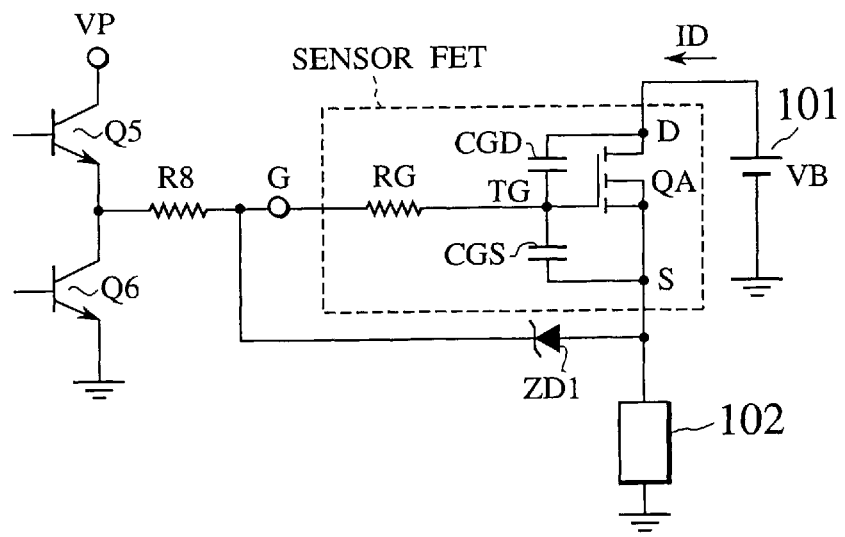
Figure 6:
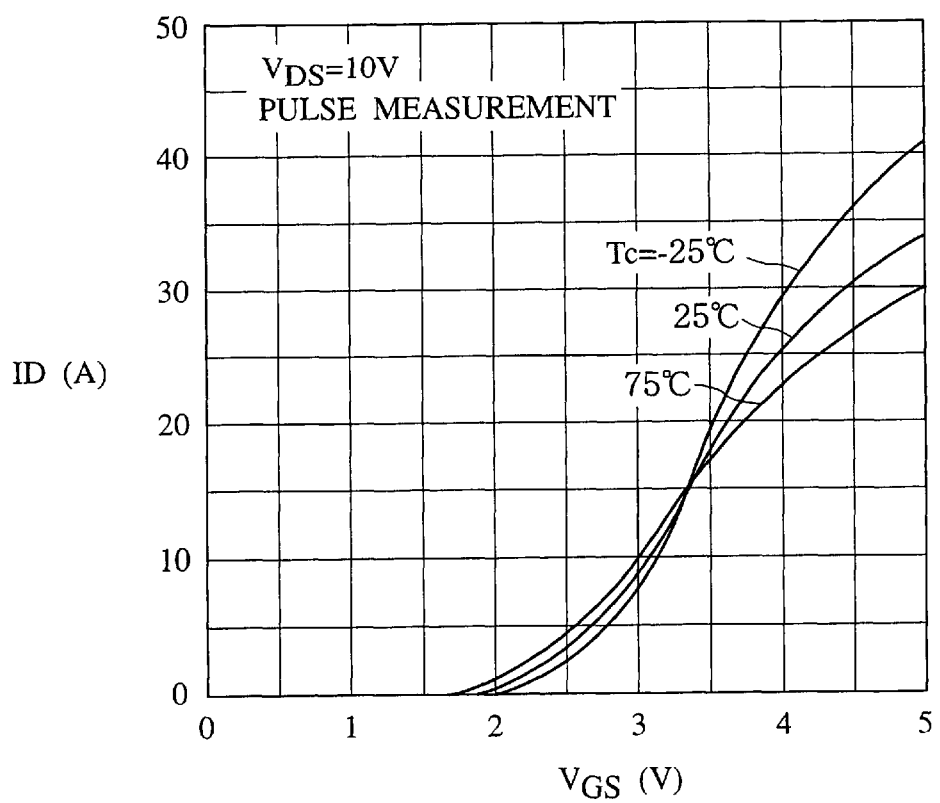
Figure 7:
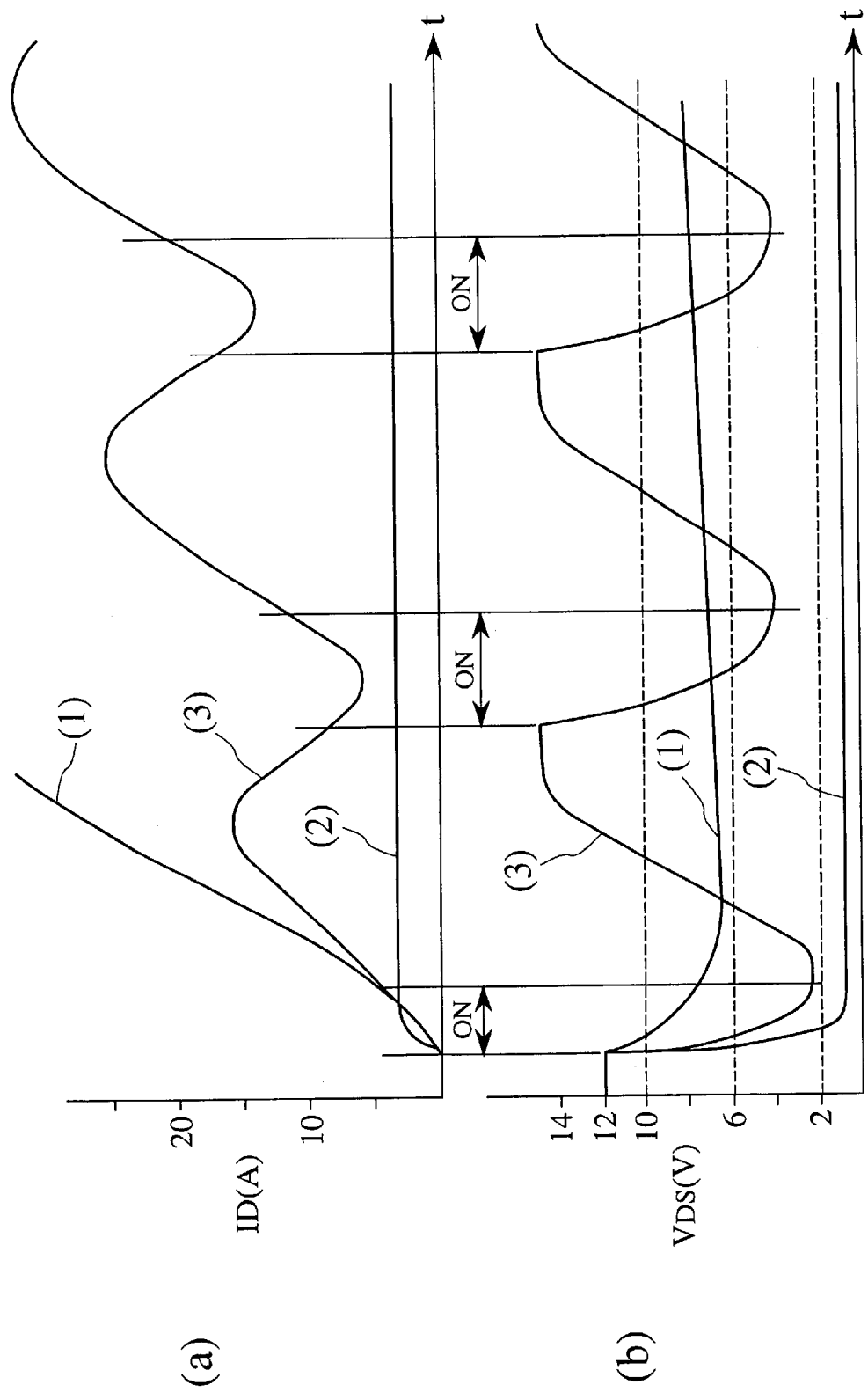
FIG. 7 is a schematic diagram showing waveforms of the electric current and the voltage of the semiconductor switch of the electric power supply control device in accordance with the present invention in the case that there is generated a short-circuit and in the case that the electric power supply control device is normally operating.

In this case, FIG. 2 is a circuit diagram showing the electric power supply control device in accordance with an embodiment of the present invention; FIG. 3 is a circuit diagram showing the semiconductor switch for use in the embodiment of the present invention; FIGS. 4 to 6 are explanatory views for explaining the mechanism of the electric power supply control device and the electric power supply control method in accordance with the present invention; FIG. 7 is a schematic diagram showing waveforms of the electric current and the voltage of the semiconductor switch of the electric power supply control device in accordance with the present invention in the case that a short-circuit is generated and in the case that the electric power supply control device operates normally.

The electric power supply control device in accordance with the present invention is provided with a switching circuit which can be called as a current vibrating type shutdown circuit. The reason will be apparent from the following description. As illustrated in FIG. 2, the electric power supply control device is composed of a temperature sensor FET QA as a semiconductor switch on the line for supplying the output voltage VB of an electric power source 101 to a load 102 connected in series with the drain and the source of the temperature sensor FET QA. While the temperature sensor FET QA is implemented with NMOS transistors of the DMOS type structure, PMOS transistors can be used in place of the NMOS transistors for the same purpose. In the same figure, the control circuitry for driving the temperature sensor FET QA is implemented with a reference FET QB, the resistor R1, R2, R5, R8, R10, RG, Rr and RV, a zener diode ZD1, a diode D1, a comparator CMP1, a driving circuit 111 and a switch SW1. Meanwhile, in the same figure, the references composed of "R" and a numeral (s) appended thereto are also used to indicate the resistance values of the respective resistors by the numeral(s) in addition to the usual purpose for designating illustrated corresponding symbols. Also, the circuitry 110a enclosed with a broken line as illustrated in FIG. 2 designates the analog circuit to be integrated within a chip (the current vibrating type shutdown circuit). Of course, other circuit elements will be suitably integrated within the same chip.

The load 102 is for example a driving motor for controlling the open/close operation of a wiper or a power window, and so forth, which becomes operating when a user turns on the switch SW1. The driving circuit 111 is composed of a source transistor Q5 connected to the potential level VP by the collector thereof and a sink transistor Q6 connected to the ground level GND by the emitter thereof, and outputs a control signal for taking control of the operation of the temperature sensor FET QA by the on/off operation of the source transistor Q5 and the sink transistor Q6. Meanwhile, in the same figure, the output voltage VB is the output of the electric power source 101 which is, for example, 12V. Also, the output voltage VP of the charge pump circuit is, for example, VB+10 V.

FIG. 3 is a circuit diagram showing the temperature sensor FET QA functioning as a semiconductor switch for use in the embodiment of the present invention. In the same figure, the temperature sensor FET QA is composed of a resistor RG, a temperature sensor 121, a latch circuit 122 and an overheat preventing FET QS. Meanwhile, the reference ZD1 designates a zener diode for allowing an electric current to flow bypassing the gate G when an excessive voltage would be applied to the gate G.

In other words, the temperature sensor FET QA in accordance with the present invention serves to detect the temperature thereof elevating beyond a predetermined level by the temperature sensor 121, and then to latch the information as detected by the latch circuit 122. Thereafter, the temperature sensor FET QA is forcibly turned off by turning on the overheat preventing FET QS which functions as the gate shutting down circuit in accordance with the overheat shutdown mechanism implemented therein.

The temperature sensor 121 is composed of four diodes connected in series and located in the vicinity of the temperature sensor FET QA in the implementation. Since the resistance values of the respective diodes are decreased as the temperature of the temperature sensor FET QA elevates, an FET Q51 is operated to switch over from the "on" state to the "off" state when the gate level of the FET Q51 falls to an effective level of the logic low. By this configuration, an FET Q54 is operated to switch over from the "off" state to the "on" state when the gate level of the FET Q51 is pulled up to the potential of the gate control terminal G of the temperature sensor FET QA, and then the latch circuit 122 latches "1". In this connection, the output of the latch circuit 122 becomes the "H" level so that the overheat preventing FET QS is operated to switch over from the "off" state to the "on" state. The true gate TG of the temperature sensor FET QA and the source of the temperature sensor FET QA have the same potential and therefore the temperature sensor FET QA is operated to switch over from the "off" state to the "on" state, resulting in overheat shutdown.

Also, the electric power supply control device in accordance with this embodiment of the present invention, there is provided with a protection mechanism for protecting the electric power supply control device from suffering from an excessive electric current due to a short-circuit occurring inside of the load 102 or occurring between the source of the temperature sensor FET QA and the load 102 or suffering from the abnormal electric current due to a rare short-circuit. In the followings, the configuration for implementation of the protection mechanism will be explained with reference to FIG. 2.

First, reference voltage generating circuitry is composed of the reference FET QB and the resistor Rr which is located outside of the chip 110a. The drain and the gate of the reference FET QB are connected respectively to the drain D and the gate of the temperature sensor FET QA while the source SB of the reference FET QB is connected to one terminal of the resistor Rr whose the other terminal is connected to the ground level GND. In this manner, since the drain and the gate of the temperature sensor FET QA are coupled with the drain and the gate of the reference FET QB, it becomes easy to integrate them within the same chip 110a. Furthermore, since the resistor Rr is located outside of the chip 110a, it becomes possible to prevent the reference potential from being affected by temperature variation of the chip 110a and therefore to realize current detection with high accuracy.

Also, the reference FET QB and the temperature sensor FET QA are integrated within the same chip 110a by the same process. The current detection technique in accordance with this embodiment of the present invention is performed on the basis of the differential voltage as detected by the comparator CMP1 between the reference potential and the drain-to-source voltage $V_{DSA}$ of the temperature sensor FET QA, so that it is possible to eliminate or suppress the common factors of incurring the current detection in error, i.e., the influence of the drift of temperature or current/voltage and the influence of the characteristic dispersion among lots since the reference FET QB and the temperature sensor FET QA are integrated within the same chip 110a by the same process.

Furthermore, the number of the constituent transistors of the reference FET QB is smaller than that of the temperature sensor FET QA in order that the electric current capacity of the reference FET QB is smaller than that of the temperature sensor FET QA. For example, the number of the constituent transistors of the reference FET QB is 1 while the number of the constituent transistors of the temperature sensor FET QA is 1000.

Furthermore, the resistance value of the resistor Rr is determined to be the resistance value of the load 102 multiplied by (the constituent transistors of the temperature sensor FET QA=1000)/(the constituent transistors of the reference FET QB=1) as explained in the following description. It is possible to generate the drain-to-source voltage of the reference FET QB corresponding to the drain-to-source voltage $V_{DS}$ of the temperature sensor FET QA through which the load current (5 mA) is flowing in the normal operation by adjusting the resistor Rr. Also, in accordance with the circuit configuration as detailedly explained in the above, it is possible to minimize the configuration of the reference voltage generating circuitry composed of the reference FET QB and the resistor Rr.

The variable resistor RV is located outside of the chip and is connected to the resistor R2 in parallel. By adjusting the resistance value of the variable resistor RV, the resistance value of the resistor R2 can be adjusted in correspondence. Namely, the resistors R1, R2 and RV constitute the voltage dividing circuit for dividing the drain-to-source voltage $V_{DSA}$ of the temperature sensor FET QA in the division ratio corresponding to the resistance values of these resistors and supplying the divided voltage to the comparator CMP1 in order to make it possible to adjust the division ratio by changing the variable resistor RV. By this configuration, it is possible to adjust the threshold of the drain-to-source voltage $V_{DSA}$, across which the output of the comparator CMP1 switches over the "H" level to the "L" level, while the reference voltage generating circuitry generates a fixed reference voltage. By this configuration, even in the case of an analogue integration, a plurality of specifications can be satisfied with one kind of the chip 110a.

Namely, while the reference voltage is fixed corresponding to the resistor Rr, the variable resistor RV is provided in order to adjust the threshold of the drain-to-source voltage $V_{DSA}$. An appropriate positive voltage is applied by this resistor to the input terminal "+". of the comparator CMP1 in order to turn on the temperature sensor FET QA having been turned off. The voltage at the connection point of the resistor R1 and the resistor R2 is in the vicinity of the power voltage VB, as long as the load is in its normal condition, when the temperature sensor FET Q is turned on. However, the voltage at the connection point of the resistor R1 and the resistor R2 falls, for example, when there has been generated a short-circuit in the load. On the other hand, when the voltage at the connection point of the resistor R1 and the resistor R2 is lowered below the voltage applied to the resistor Rr, the output of the comparator CMP1 is inverted. The voltage applied to the resistor Rr falls toward the ground potential just after the reference FET QB is turned off, and then the output of the comparator CMP1 is inverted again when the voltage applied to the resistor Rr is lowered below the voltage at the connection point of the resistor R1 and the resistor R2. This repetition results in an oscillation. As explained in the following description, a clamp circuit consisting of the diode D1 is provided in order to avoid the oscillation for the stabilized operation of the electric power supply control device.

The input terminal "+" of the comparator CMP1 is given, through the resistor R5, the voltage generated by dividing the drain-to-source voltage $V_{DSA}$ of the temperature sensor FET QA by the resistor R1 and the parallel connection (R2 ∥ RV) of the resistor R2 and the variable resistor RV. Also, the input terminal "−" of the comparator CMP1 is given the drain-to-source voltage $V_{DSA}$ of the reference FET QB. Namely, the output of the comparator CMP1 is active ("H" level) if the potential level at the input terminal "+" of the comparator CMP1 is higher than that at the input terminal "−" of the comparator CMP1; while the output of the comparator CMP1 is inactive ("L" level) if the potential level at the input terminal "+" is lower than that at the input terminal "−" of the comparator CMP1. As explained in the following description, the comparator CMP1 has a certain hysteresis feature.

Next, with the circuit configuration of the electric power supply control device in accordance with this embodiment of the present invention as explained above in mind, the electric power supply control method in accordance with the present invention will be explained. In advance of specifically explaining the operation, the basic mechanism of the electric power supply control device and the electric power supply control method in accordance with the present invention will be explained with reference to FIG. 4, FIG. 5 and FIG. 6. FIG. 4 is a view for explaining the characteristic feature of the drain-to-source voltage, which is falling down, while the temperature sensor FET QA is operated to switch over from the "off" state to the "on" state; FIG. 5 is a schematic circuit diagram of the temperature sensor FET QA; and FIG. 6 is a view for explaining the characteristic feature of the drain current of the temperature sensor FET in response to the gate-to-source voltage.

In the case that the temperature sensor FET QA is used as the semiconductor switch, the electric power supplying path from the electric power source 101 to the load 102 is schematically as illustrated in FIG. 5. The load 102 is composed of the wiring inductance L0 and the wiring resistance R0 of the electric power supplying path. Meanwhile, in the case that there is generated a short-current on the wiring inductance or in the load 102, the wiring resistance R0 consists also of the wiring resistance R0. Herein, on the assumption that the load 102 is the headlamp of a motor vehicle, the short-circuit resistance is no higher than 40 mΩ in the case of a typical short-circuit (the dead short) and about 40 to 500 mΩ in the case of a rare short-circuit.

On the other hand, FIG. 4 is a view for explaining the characteristic feature of the drain-to-source voltage $V_{DS}$, which is falling down, of the temperature sensor FET QA as part of the electric power supplying path while the temperature sensor FET QA is operated to switch over from the "off" state to the "on" state. Namely, illustrated in FIG. 4 is the characteristic feature of the drain-to-source voltage $V_{DS}$, which is falling down, in the case of the short-circuit, in the case of a normal load (the normal operation) and in the case of the load 102 whose resistance is 1 KΩ. In this manner, the characteristic feature of the drain-to-source voltage $V_{DS}$, which is falling down, is depending upon the condition of the load and the electric power supplying path, i.e., depending upon the time constant corresponding to the wiring resistance, the wiring inductance and the short-circuit resistance of the electric power supplying path.

The variation of the characteristic of the drain-to-source voltage $V_{DS}$ can be used for detecting an excessive electric current as explained in the following description. In addition to the following technique, an excessive electric current can be detected by comparison of the drain-to-source voltage $V_{DS}$ with the threshold at a predetermined time point. However, in this case, there have to be provided with a plurality of resistors and capacitors for implementing suitable circuitry for determining the predetermined time point and performing the comparison. The dispersion of the characteristics of these elements tends to result in an error of the detection. Also, the capacitors as required can not be integrated within the same chip so that they are provided as "off" chip elements, resulting in an increase in costs.

In FIG. 4, the temperature sensor FET QA is operated in the pinch-off region until the temperature sensor FET QA is turned on so that the drain-to-source voltage $V_{DS}$ is saturated.

Also, in the case that the resistance of the load 102 is 1 KΩ, the variation of the drain-to-source voltage $V_{DS}$ is as explained in the following description. Namely, at the outset, e.g., in the case that the temperature sensor FET QA comprises "HAF2001" as distributed by Hitachi Ltd., the gate-to-source voltage $V_{TGS}$ is maintained at 1.6V with the power voltage of 12V and the drain current ID=12 m. Secondly, since the gate G is continuously charged by the driving circuit 111, the gate-to-source voltage $V_{TGS}$ seems to increase. However, the drain-to-source voltage $V_{DS}$ falls in order to increase the drain-to-gate capacitance $C_{GD}$ so as to absorb the electric charge effective to increarse the gate-to-source voltage $V_{TGS}$ up to the gate-to-source voltage $V_{TGS}$. In other words, the drain-to-source voltage $V_{DS}$ falls at a speed required for discharging electric charge from the drain-to-gate capacitance $C_{GD}$ in order not to elevate the gate-to-source voltage $V_{TGS}$. By this configuration, the gate-to-source voltage $V_{TGS}$ is maintained at 1.6 V. Also, as the drain-to-gate voltage $V_{TGD}$ falls, the drain-to-source voltage $V_{DS}$ also falls. Meanwhile, there are two factors effective to absorb electric charge. One of them is the discharge of the drain-to-gate capacitance $C_{GD}$, so called the mirror capacitance, due to the decrease of the drain-to-gate voltage $V_{TGD}$. The other is the increase of the drain-to-gate capacitance $C_{GD}$ due to the contraction of the depletion layer.

Also, the variation of the drain-to-source voltage $V_{DS}$ in the case that the load resistance=1 KΩ can be interpreted as described below. Namely, at the respective time points elapsed after the temperature sensor FET QA is turned on, the drain-to-source voltage $V_{DS}$ is such as a value required for absorbing the electric charge transferred from the driving circuit 111 to the gate G and maintaining the voltage $V_{TGS}$ at the true gate TG. Accordingly, if the drain-to-source voltage $V_{DS}$ at a certain time point elapsed after turning on the temperature sensor FET QA is higher than the curve as illustrated in FIG. 4 corresponding to the load resistance=1 KΩ, the gate-to-source voltage $V_{TGS}$ is higher than 1.6 V. Meanwhile, the drain-to-source voltage $V_{DS}$ shall not be lowered below the curve as illustrated in FIG. 4 corresponding to the load resistance=1 KΩ.

Furthermore, the gate-to-source voltage $V_{TGS}$ is 1.6 V if the electric charge corresponding to $\Delta V_{DSGAP} \times C_{GD}$ is extracted between the drain and the source at the respective time point, where the differential voltage between the drain-to-source voltage $V_{DS}$ and the curve as illustrated in FIG. 4 corresponding to the load resistance=1 KΩ is $\Delta V_{DSGAP}$. In other words, the gate-to-source voltage $V_{TGS}$ has an extra potential corresponding to this electric charge in addition to 1.6 V. This is expressed by the following equation.

$$V_{TGS} - 1.6 = \Delta V_{DSGAP} \times C_{GD}/(C_{GS} \times C_{GD})$$

Namely, A $V_{DSGAP}$ is in proportion to (the gate-to-source voltage $V_{TGS}$-1.6V).

Also, there is established a one-to-one correspondence between the drain current ID and the gate-to-source voltage $V_{TGS}$ with an approximately porportional relationship as illustrated in FIG. 6. Here, the characteristics as illustrated in FIG. 6 have been obtained with "HAF2001" as distributed by Hitachi Ltd. where $V_{GS}$ corresponds to the gate-to-source voltage $V_{TGS}$. Accordingly, $\Delta V_{DSGAP}$ can be considered to represent the drain current ID on the basis of the relationship as illustrated in FIG. 6. In FIG. 6, the resolving power in the vicinity of the drain current ID=10 A is approximately 60 mV/A. Namely, the variation of the drain current ID of 1A is corresponding to the gate-to-source voltage $V_{TGS}$ of 60 mV while the variation of the drain current ID of ±5A is corresponding to the gate-to-source voltage $V_{TGS}$ of ±0.4 V. Meanwhile, the resolving power is corresponding to the resolving power which is obtained in a prior art technique making use of the shunt resistor RS=60 mΩ.

Meanwhile, when the drain current ID is zero, the characteristic curve of the drain-to-source voltage $V_{DS}$ is determined simply by the circuitry for charging the gate and the mirror capacity. However, when the drain current ID is not zero, the characteristic curve of the drain-to-source voltage $V_{DS}$ is influenced also by the inductor Lc of the circuitry and the resistor Rc of the entirety of the circuit. As the drain current ID increases, the characteristic curve of the drain-to-source voltage $V_{DS}$ is pulled up. However, if the drain current ID is further increased as in a typical short-circuit (the dead short), the gradient of pulling up the drain current ID converges to a certain constant and therefore the characteristic curve of the gate-to-source voltage $V_{TGS}$ also converges. Meanwhile, the maximum gradient of the drain current ID is the gradient of the drain current ID when the variation of the drain-to-source voltage $V_{TGD}$ is zero.

Next, the operation of the temperature sensor FET QA when the driving circuit 111 is turned off, i.e., the relationship between the drain-to-source voltage $V_{DS}$ and the drain current ID will be explained in details with reference to the schematic circuit diagram as illustrated in FIG. 5.

When the source transistor Q5 is turned off followed by the sink transistor Q6 is turned on, the electric charge accumulated by the truth gate TG is discharged through the resistors RG and R8 and the sink transistor Q6.

At this time, the drain current ID is hardly not influenced during the ohmic region of the temperature sensor FET QA, even if the gate-to-source voltage $V_{TGS}$ falls and the gate of the temperature sensor FET QA is discharged. Furthermore, the drain-to-source voltage $V_{DS}$ is also hardly not influenced.

When the temperature sensor FET QA enters the pinch-off region, the discharge of the gate charge is effective to lower the gate-to-source voltage $V_{TGS}$ and decrease the drain current ID. However, the drain current ID tends to be maintained in accordance with the condition as determined by the external circuit so that the discharge of the gate charge is canceled out in order to nullify the influence upon the drain current ID. Meanwhile, the canceling mechanism is active in the range that the drain-to-source voltage $V_{DS}$ can be changed. Furthermore, this phenomena is originating from the power relationship between the tendency of varying the drain current ID and the tendency of varying the drain-to-source voltage $V_{DS}$ whereas the tendency of varying the drain-to-source voltage $V_{DS}$ is significantly weaker than the tendency of varying the drain current ID.

Even if the driving circuit 111 serves to turn off the temperature sensor FET QA during the process of increasing the drain current ID, the drain current ID can continuously increase due to the variation of the drain-to-source voltage $V_{DS}$ as long as the drain-to-source voltage $V_{DS}$ can increase. When the drain-to-source voltage $V_{DS}$ can no longer increase, the drain current ID then decreases in accordance with the potential level (the gate-to-source voltage $V_{TGS}$) which is determined only by the discharge of the gate charge. Namely, even if the driving circuit 111 serves to turn off the temperature sensor FET QA, the drain current ID is hardly influenced until the variation of the drain-to-source voltage $V_{DS}$ stops. The on/off operation of the temperature sensor FET QA is based upon the above explained mechanism.

Finally, it should be noted that the drain-to-source voltage $V_{DS}$ has a different characteristic curve thereof for a different circuit for charging the gate even with the same load current. Accordingly, the current for charging the gate has to be in the same condition. Meanwhile, the characteristic curve of the drain-to-source voltage $V_{DS}$ is pulled up when the current for charging the gate is decreased. This is used to enhance the overheat preventing mechanism by increasing the drain-to-source voltage $V_{DS}$ with the constant the drain current ID. The overheat shutdown mechanism is implemented with the characteristics as described below.

Next, with the above consideration in mind, the operation of the electric power supply control device in accordance with this embodiment of the present invention will be explained. First, the temperature sensor FET QA and the reference voltage generating circuitry (the reference FET QB and the resistor Rr) will be explained. The temperature sensor FET QA and the reference voltage generating circuitry constitute a current mirror circuit of 1000:1 and serve to generate the drain current $ID_{QA}$=1000 x the drain current $ID_{QB}$ when the voltage applied to the load resistance and the voltage applied to the resistor Rr are equal to each other.

Accordingly, when the drain current of the temperature sensor FET QA is $ID_{QA}$=5A and when the drain current of the reference FET QB is $ID_{QB}$=5mA, the drain-to-source voltage $V_{DS}$ and the gate-to-source voltage $V_{TGS}$ of the temperature sensor FET QA are equal to those of the reference FET QB. Namely, it is established that $V_{DSA}$=$V_{DSB}$ and $V_{TGSA}$=$V_{TGSB}$. In this case, $V_{DSA}$ and $V_{DSB}$ designate respectively the drain-to-source voltage of the temperature sensor FET QA and the drain-to-source voltage of the reference FET QB while $V_{TGSA}$ and $V_{TGSB}$ designate respectively the gate-to-source voltage of the temperature sensor FET QA and the gate-to-source voltage of the reference FET QB.

Accordingly, since almost the entirety of the power voltage VB is applied to the resistor Rr when the reference FET QB is completely turned on, the resistance value of the resistor Rr is calculated as the load of the reference FET QB equivalent to the load (5A) connected to the temperature sensor FET QA as explained below.

Namely, when the current mirror circuit is formed of the temperature sensor FET QA being turned on to have the entire resistor of 30 mΩ with the power voltage VB of 12V, the voltage Vra applied to the load is equal to the voltage Vrb applied to the resistor Rr from the condition that the resistance value of the resistor Rr is equal to the resistance value of the load. Then, it is obtained that Vra=Vrb=VB−(Ia×30mΩ×1000). If Ia=10A/1000=10mA, Vra=Vrb=11.7V and then Rrb=11.7V/10mA=1.17KΩ.

In this case, the calculation is based upon the temperature sensor FET QA through which the load current of 5A flows. However, the reference voltage generating circuitry can be designed in a more compact fashion in order to satisfy the function as required within a smaller chip area by the use of the reference FET QB of a smaller design proportional to the ratio of the number of the constituent transistors of the reference FET QB to the number of the constituent transistors of the temperature sensor FET QA in order to form the reference voltage generating circuitry. Furthermore, as explained above, the accuracy of the detection is significantly improved by integrating the reference FET QB and the temperature sensor FET QA within the same chip by the same process in order to remove the influence of the temperature drift.

Next, the operation of the pinch-off region will be explained. When the temperature sensor FET QA is operated to switch over from the "off" state to the "on" state, the drain current is pulled up to the final load current determined by the circuit resistance. Also, the gate-to-source voltage $V_{TGSA}$ of the temperature sensor FET QA has the value as determined by the drain current $ID_{QA}$, and is pulled up while being braked by the mirror effect of the capacitance $C_{GD}$ due to falling down of the drain-to-source voltage $V_{DSA}$. Furthermore, the gate-to-source voltage $V_{TGSB}$ of the reference FET QB is determined on the basis of the fact that the reference FET QB is operating in a source follower configuration with the load of the resistor Rr=1.4 KΩ.

Also, the gate-to-source voltage $V_{TGSA}$ of the temperature sensor FET QA increases as the drain current $ID_{QA}$ increases, and therefore the drain-to-source voltages satisfy the equation of $V_{TGSB}<V_{TGSA}$. Furthermore, $V_{DSA}-V_{DSB}=V_{TGSA}-V_{TGSB}$ is derived from the equations of $V_{DSA}=V_{TGSB}+V_{TGD}$ and $V_{DSB}=V_{TGSB}+V_{TGD}$. In this case, since the differential voltage $V_{TGSA}-V_{TGSB}$ of the gate-to-source voltages corresponds to the differential current $ID_{QA}-ID_{QB}$ of the drain currents, the differential current between the drain current $ID_{QA}$ and the electric current $ID_{QB}$ flowing through the reference voltage generating circuitry can be obtained by detecting the differential voltage $V_{TGSA}-V_{GSB}$. The electric current $ID_{QB}$ as flowing through the reference voltage generating circuitry approaches 5 mA corresponding to the drain current $ID_{QA}$=5A as the drain-to-source voltage $V_{DSB}$ of the reference FET QB decreases (the drain-to-source voltage $V_{DSA}$ of the temperature sensor FET QA decreases at the same time).

The drain-to-source voltage $V_{DSB}$ of the reference FET QB is directly input to the input terminal "−" of the comparator CMP1 while the drain-to-source voltage $V_{DSA}$ of the temperature sensor FET QA is divided by the resistor R2 and the resistor R1 and input to the input terminal "+" of the comparator CMP1 (where the consideration of the variable resistor RV is dispensed with). Namely, the comparator CMP1 receives at the input terminal "+" the voltage of $$V_{DSA} \times R1/(R1+R2) \tag{1}$$

While the drain-to-source voltage $V_{DSB}$ is greater than $V_{DSA}\times R1/(R1+R2)$ just after the temperature sensor FET QA is turned on, the value (1) of $V_{DSA}\times R1/(R1+R2)$ increases as the drain current $ID_{QA}$ of the temperature sensor FET QA increases. When the value (1), i.e., $V_{DSA}\times R1/(R1+R2)$ increases to exceed the drain-to-source voltage $V_{DSB}$ of the reference FET QB, the output of the comparator CMP1 switches over the "H" level to the "L" level in order that the temperature sensor FET QA is turned off by means of the driving circuit 111.

Meanwhile, the comparator CMP1 forms a hysteresis loop with the diode D1 and the resistor R5. Since the gate of the temperature sensor FET QA is grounded when the temperature sensor FET QA is turned off, the differential potential between the cathode of the diode D1 and the drain of the temperature sensor FET QA becomes $V_{DSB}$−0.7V (the voltage in the forward direction of the zener diode ZD1) and therefore an electric current flows as the resistor R1 →the resistor R5 → the diode D1 so that the potential level at the input terminal "+" of the comparator CMP1 is lowered than that when the driving circuit 111 is turned on. Accordingly, the temperature sensor FET QA is maintained turned off until the differential voltage $V_{DSA}-V_{DSB}$ which is narrower than that when the temperature sensor FET QA switch over from the "on" state to the "off" state. The temperature sensor FET QA thereafter switch over from the "off" state to the "on" state. Because of the hysteresis loop, the potential level at the input terminal "+" of the comparator CMP1 is prevented from oscillating around the reference voltage. This is only one example of several techniques for introducing the hysteresis loop.

In this case, the following equation is satisfied.

$$V_{DSATH}-V_{DSA}=R2/R1\times V_{DSB} \text{ (at 5mA)} \tag{2}$$

wherein $V_{DSATH}$ is a threshold voltage corresponding to the drain-to-source voltage $V_{DSA}$ when the temperature sensor FET QA is turned off.

The reference value of $V_{DSATH}-V_{DSA}$ for judgment of an excessive electric current is therefore determined by the equation (2). Meanwhile, the reference value of $V_{DSATH}-V_{DSA}$ can be changed by adjusting the variable resistor RV which is located outside of the chip 110a and connected in parallel to the resistor R2. The reference value of $V_{DSATH}-V_{DSA}$ for judgment of an excessive electric current can be lowered by lowering the value of the resistor of the variable resistor RV.

Next, the operation within the ohmic region will be explained. When the temperature sensor FET QA is turned on In an normal wiring condition, the temperature sensor FET QA continuously maintains its "on" state so that the gate-to-source voltages $V_{TGSA}$ and $V_{TGSB}$ reach near to 10V, and therefore both the temperature sensor FET QA and the reference FET QB are operated in the ohmic region.

There is not established in this region the one-to-one correspondence between the gate-to-source voltage $V_{GS}$ and the drain current ID. In the case of "HAF2001" as distributed by Hitachi Ltd., the "on" resistance RDS(ON)=30 mΩ when the gate-to-source voltage $V_{GS}$=10V, and then the following equations are satisfied.

$$V_{DSB}=5[A]\times 30[m\Omega]=0.15[V]$$

$$V_{DSA}=ID_{QA}\times 30[m\Omega]$$

$$V_{DSA}-V_{DSB}=30[m\Omega]\times(ID_{QA}-5[A]) \qquad (3).$$

When the drain current $ID_{QA}$ is further increased due to a short-circuit occurring in the wirings beyond the reference value of $V_{DSATH}-V_{DSA}$ for judgment of an excessive electric current, the temperature sensor FET QA is turned off. The temperature sensor FET QA is then operating in the pinch-off region as described above in order to repeatedly switch over the "on" state to the "off" state and vice versa, and finally results in overheat shutdown. Meanwhile, if the normal wiring is recovered before overheat shutdown (e.g., as in the case of intermittent shorting), the temperature sensor FET QA becomes maintaining its "on" state to operate in the ohmic region.

FIG. 7 is a schematic diagram showing waveforms of the electric current and the voltage of the temperature sensor FET QA of the electric power supply control device in this embodiment of the present invention. FIG. 7(a) is a graphic diagram showing the characteristic curves of the drain current ID(A) and FIG. 7(b) is a graphic diagram showing the characteristic curves of the drain-to-source voltage $V_{DS}$. In the figures, ① designates the characteristic curves in the case of a typical short-circuit (dead short); ② designates the characteristic curves in the case of the normal operation; and ③ designates the characteristic curves in the case of the rare short.

In the case that the typical short-circuit (dead short) occurs as illustrated in FIG. 7 with ①, the drain current ID rapidly start flowing when the temperature sensor FET QA switches from the "off" state to the "on" state. The "on" state of the temperature sensor FET QA is maintained to overheat the temperature sensor FET QA, which is then shut down in accordance with the protection mechanism for the overheat shutdown by turning on the overheat preventing FET QS.

On the other hand, in the case that a rare short-circuit occurs with a certain short-circuit resistance as illustrated in FIG. 7 with ③, the temperature sensor FET QA repeats the on/off operation to largely fluctuate the drain current ID, resulting in the cyclic heating of the temperature sensor FET QA. The temperature sensor FET QA is then quickly shut down by the protection mechanism for the overheat shut-down by turning on the overheat preventing FET QS.

On the other hand, while it is desired to shut down the current paths by the protection mechanism in the case of the dead short, it is also the case that an excessive electric current is detected with no hardware trouble. More specifically speaking, this occurs when a motor is locked. In such a case, it is not desirable to immediately shut down the current paths. This is because the motor may possibly be unlocked in a short time by removing the obstacle.

The short-circuited condition and the locking condition of a motor are substantially different from each other in the inductance of the system. In the case of the dead short, the inductance of the system is thought to be very small. Namely, in the actual case, the inductance thereof is no more larger than the inductance of the wiring harness. In the case of a usual operation of a motor, the rate of increasing the electric current, i.e., the rising time ( di/dt) of the electric current is small because of the large inductance. Contrary to this, in the case of the locking condition of a motor, the effective inductance becomes small so that the rising time (di/dt) of the electric current becomes long.

Figure 8:
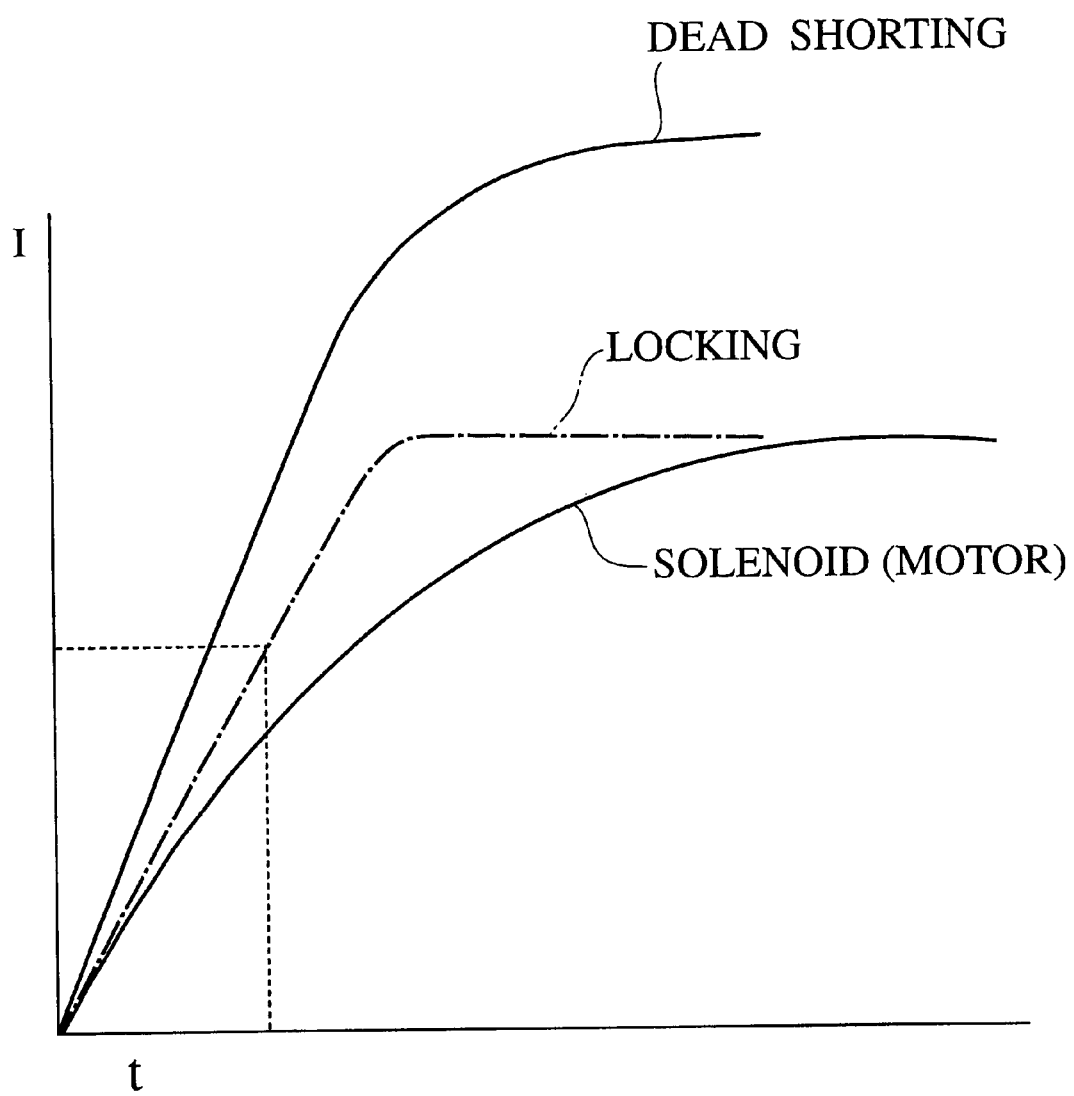
FIG. 8 is a graphic diagram showing the variation of the electric current rising after the load is turned on at t=0 in the case of the electric power supply control device in accordance with the present invention.

FIG. 8 is a graphic diagram showing the variation of the electric current rising after turning on the load at t=0. Namely, in a normal condition, the electric current rises slowly because of the rotation of a motor. On the other hand, if there is a short-circuit, the electric current rises quickly because of the small inductance. In the case with the locking condition of a motor, the electric current rises at an intermediate speed therebetween.

Accordingly, it is possible to distinguish the locking condition of a motor from a dead short by detecting the rising time of the electric current.

For this purpose, in accordance with the present invention, another current detection circuit is provided in order to distinguish the locking condition of a motor from a dead short. Namely, an FET QC is connected in parallel to the reference FET QB. The drain of the FET QC is grounded through an external resistor Rc. Also, the drain of the FET QC is connected to the minus terminal of a comparator CMP2. On the other hand, the plus terminal of the comparator CMP2 is connected to the source terminal of the temperature sensor FET QA. Accordingly, if the electric current flowing through the load 102 is greater than the locking reference current as determined by the external resistor Rc, the comparator CMP2 outputs for example 12V. Otherwise, the comparator CMP2 outputs the ground potential. In this connection, the locking reference current is predetermined at an appropriate level which is lower than the current level for detecting an excessive electric current.

The output of the comparator CMP2 is detected at the time when a one-shot circuit SC outputs a control pulse to the base of the output level detection transistor Q7. The emitter of the output level detection transistor Q7 is grounded through the resistor Rc and is connected to the switching circuit SW located between the comparator CMP1 and the driving circuit 111. The switching circuit SW serves to pass the output signal of the comparator CMP1 to the driving circuit 111 as it is, in the initial state of the switching circuit SW. When the potential of the emitter of the output level detection transistor Q7 rises, the switching circuit SW is turned off in response, in order to disconnect the driving circuit 111 from the comparator CMP1.

The one-shot circuit SC serves to output the control pulse after there appears a substantial difference between the short-circuited condition and the locking condition of a motor in the current level. At this time, if there is the locking condition of a motor, the control signal is input to the switching circuit SW in order to disable the detection of an excessive electric current by means of the comparator CMP1. The switching circuit SW is maintained turned off for an appropriate time period, e.g., 10 seconds to one minute, and then recovered to be the initial state thereof.

As explained above, in accordance with the electric power supply control device and the electric power supply control method of this embodiment of the present invention, there is no longer need for providing the shunt resistor in a prior art technique. Even without the shunt resistor, it is possible to detect an excessive electric current with high accuracy so as to suppress the thermal loss of the entirety of the system. Also, it is possible to detect an abnormal electric current due to a rare short circuit having a certain short-circuit resistance, in addition to an abnormal electric current due to a typical short-circuit, by means of hardwired control.

Furthermore, it is possible to await for recovery of the normal condition of the electric power supply control device, when an excessive electric current which is not originating from a trouble of the hardware flows, rather than immediately shutting down the current path of the excessive electric current.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. An electric power supply control device for supplying electric power to a load from a battery comprising:

a semiconductor switch connected between said electric power supply and said load in order to control the supply of power to said load;

an excess electric current detecting circuit for detecting an excess electric current flowing through said load;

a protection circuit connected to said semiconductor switch for turning off said semiconductor switch if said excess electric current detecting circuit detects an excess electric current; and a control circuit for disabling the protection circuit turn off of said semiconductor switch if the rate of increase of the electric current flowing through said load is smaller than a predetermined rate.

2. The electric power supply control device as claimed in claim 1, wherein the rate of increase of the electric current is detected by measuring the level of the electric current a predetermined time after the supply of the electric power to said load is initiated.

3. The electric power supply control device as claimed in claim 1, wherein said control circuit serves to enable control by said protection circuit again after disabling the protection circuit turn off of said semiconductor switch.

4. An electric power supply control method for supplying electric power to a load from a battery comprising the steps of:

initiating supply of electric current to said load;

detecting a rate of increase of the electric current through said load;

continuing the supply of electric current to said load if the rate of increase of the electric current through said load is lower than a predetermined value; and halting the supply of electric current to said load if the rate of increase of the electric current through said load is higher than a predetermined value.

5. The electric power supply control method as claimed in claim 4, wherein the step of detecting the rate of increase of the electric current through said load is performed by measuring the magnitude of the electric current in a predetermined time after initiating supply of electric power to said load.

* * * * *

UNITED STATES PATENT AND TRADEMARK OFFICE
CERTIFICATE OF CORRECTION

PATENT NO. : 6,222,709 B1  Page 1 of 1
DATED : April 24, 2001
INVENTOR(S) : Akira Baba It is certified that error appears in the above-identified patent and that said Letters Patent is hereby corrected as shown below:

<u>Title page,</u>
Item [57], ABSTRACT, line 5, "to controlling" should read -- to control --.

Signed and Sealed this

Ninth Day of April, 2002

Attest:

*Attesting Officer*

JAMES E. ROGAN
*Director of the United States Patent and Trademark Office*